United States Patent
Abuelma'atti

(10) Patent No.: US 8,368,464 B2
(45) Date of Patent: Feb. 5, 2013

(54) BALANCED OUTPUT SIGNAL GENERATOR

(75) Inventor: Muhammad Taher Abuelma'atti, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 100 days.

(21) Appl. No.: 13/047,589

(22) Filed: Mar. 14, 2011

(65) Prior Publication Data

US 2012/0235765 A1    Sep. 20, 2012

(51) Int. Cl.
*H03F 3/45* (2006.01)
(52) U.S. Cl. .......................... 330/69; 330/301
(58) Field of Classification Search ............ 330/69, 330/124 R, 275, 295, 301
See application file for complete search history.

(56) References Cited

U.S. PATENT DOCUMENTS

| | | | |
|---|---|---|---|
| 4,338,527 A | 7/1982 | Nagano | |
| 4,543,496 A | 9/1985 | Shepler | |
| 5,625,320 A | 4/1997 | Hagerty | |
| 6,002,270 A | 12/1999 | Timoc | |
| 6,222,416 B1 * | 4/2001 | Edeler | 330/69 |
| 6,239,620 B1 | 5/2001 | Aoki et al. | |
| 7,061,282 B2 | 6/2006 | Hu | |
| 7,304,535 B2 * | 12/2007 | Lam | 330/69 |
| 7,705,683 B2 | 4/2010 | Zolfaghari | |
| 7,952,428 B2 * | 5/2011 | Golden et al. | 330/69 |
| 8,138,830 B2 * | 3/2012 | Bugyik | 330/69 |
| 2004/0196083 A1 | 10/2004 | Dunsmore | |
| 2005/0174149 A1 | 8/2005 | Hu | |

FOREIGN PATENT DOCUMENTS

KR    2003-0053492    6/2003

* cited by examiner

*Primary Examiner* — Khanh V Nguyen
(74) *Attorney, Agent, or Firm* — Richard C. Litman

(57) ABSTRACT

The balanced output signal generator uses four interconnected plus-type second-generation current conveyors, a couple of load resistors and a single input resistor that can provide both current- and voltage-mode outputs. No matching conditions are required.

2 Claims, 1 Drawing Sheet

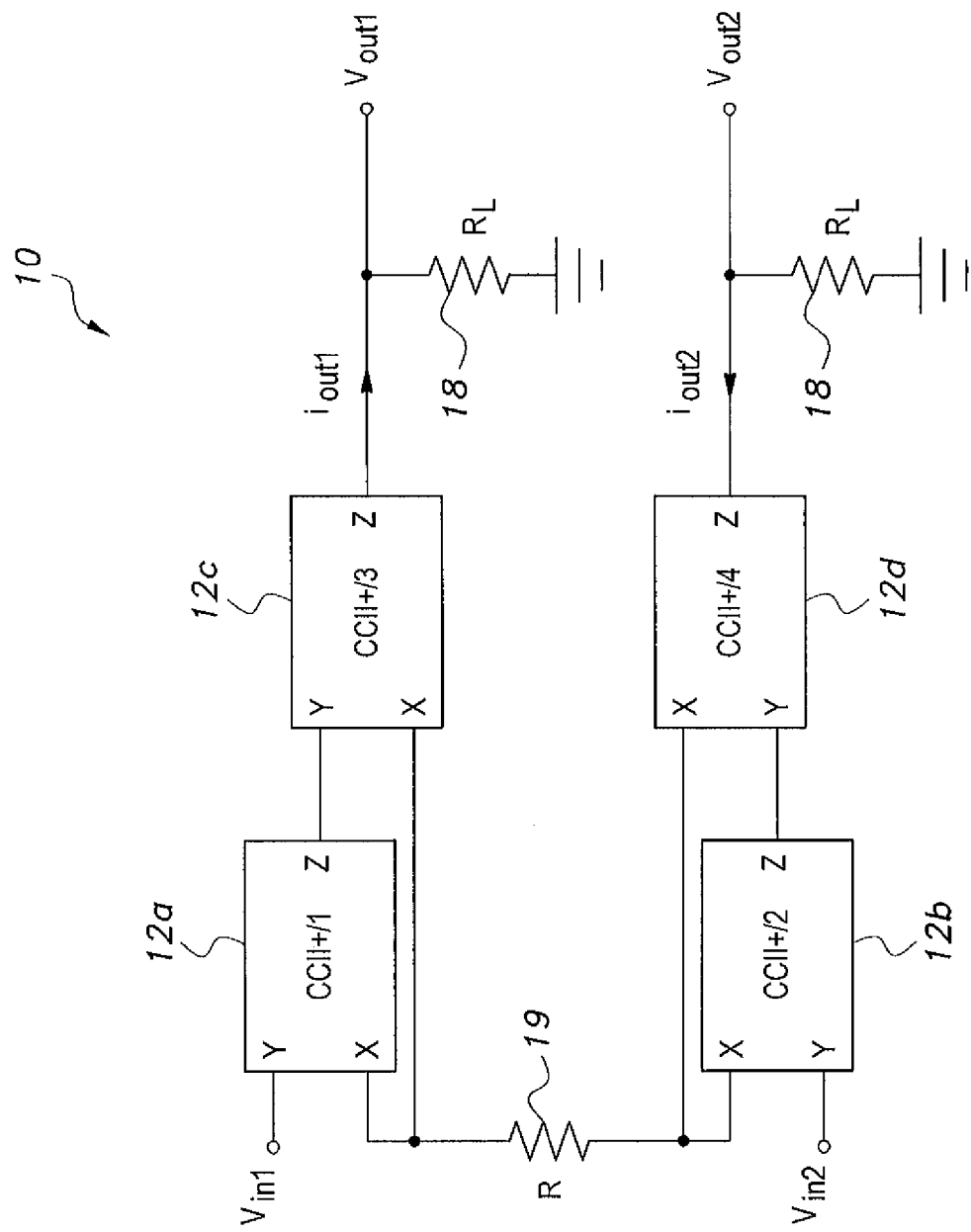

BALANCED OUTPUT SIGNAL GENERATOR

BACKGROUND OF THE INVENTION

1. Field of the Invention

The present invention relates to signal generators, and particularly to a balanced output signal generator.

2. Description of the Related Art

Balanced-output-signal generators are widely used in many applications, such as the transmission of analog signals over long wires in order to reject unwanted common mode signals, in synchronous detection, and in lock-in-based systems. This justifies the numerous attempts reported in the literature to design such generators using operational amplifiers and plus-type second-generation current-conveyors (CCII+). However, most of the available circuits suffer from one or more disadvantages, such as requiring extensive matching conditions between active and passive elements in order to achieve high common-mode rejection ratio. The use of operational amplifiers, with their finite values of gain-bandwidth products, limits the frequency range of operation, resulting in narrowband balanced-output-signal generators and the use of two different types of active elements.

Thus, a balanced output signal generator solving the aforementioned problems is desired.

SUMMARY OF THE INVENTION

The balanced output signal generator uses four interconnected plus-type second-generation current conveyors, a couple of load resistors, and a single input resistor that can provide both current- and voltage-mode outputs. No matching conditions are required.

These and other features of the present invention will become readily apparent upon further review of the following specification and drawings.

BRIEF DESCRIPTION OF THE DRAWING

The sole drawing Figure is a schematic diagram of a balanced output signal generator circuit according to the present invention.

DETAILED DESCRIPTION OF THE PREFERRED EMBODIMENTS

The balanced output signal generator 10 shown in the drawing includes four CCII+ monolithic integrated circuits 12a, 12b, 12c, and 12d. Details and theory of operation of an exemplary CCII similar to CCII+ 12a, 12b, 12c, and 12d, are included in U.S. Pat. No. 3,619,798, issued on Nov. 9, 1971, which is hereby incorporated by reference in its entirety. The CCII+/1 12a and CCII+/2 12b will force the voltage difference across the resistance R 19 to be equal to $(V_{in1}-V_{in2})$. Thus, the current through this resistance will be $(V_{in1}-V_{in2})/R$. With terminal Z of CCII+/1 12a connected to terminal Y of CCII+/3 12c, the current through terminal Z of CCII+/1 12a will be forced to zero. Thus, the current through terminal X of CCII+/1 12a will be forced to zero. Similar arguments apply to the currents in terminals Z and X of CCII+/2 12b. Thus, the current through terminals X of CCII+/3 12c and CCII+/4 12d will be forced to be equal to $(V_{in1}-V_{in2})/R$. This current will produce an outward current through terminal Z of CCII+/3 12c and an inward current through terminal Z of CCII+/4 12d. Thus, the output currents will be given by:

$$I_{out1} = \frac{1}{R}(V_{in1} - V_{in2}) \qquad (1)$$

and $$I_{out2} = -\frac{1}{R}(V_{in1} - V_{in2}) \qquad (2)$$

Equations (1) and (2) represent the output currents of a current-mode balanced output signal generator. Moreover, if output voltages are required, then by connecting the resistors $R_L$ 18, the output voltages will be given by:

$$V_{out1} = \frac{R_L}{R}(V_{in1} - V_{in2}) \qquad (3)$$

and $$V_{out2} = -\frac{R_L}{R}(V_{in1} - V_{in2}) \qquad (4)$$

Equations (3) and (4) represent the outputs of a voltage-mode balanced output signal generator.

A new CCII+ based balanced-output-signal generator 10 has been disclosed. The circuit can be easily implemented using off-the-shelf components, including four AD844 CCII+ integrated circuits and one input resistor 19. The circuit can provide both current- and voltage-mode outputs.

It is to be understood that the present invention is not limited to the embodiments described above, but encompasses any and all embodiments within the scope of the following claims.

I claim:

1. A balanced output signal generator, comprising:
   first, second, third, and fourth positive polarity second-generation current conveyors, each having an X-input, a Y-input, and a Z-output, the Z-output of the first positive polarity second-generation current conveyor being connected to the Y-input of the third positive polarity second-generation current conveyor, the Z-output of the second positive polarity second-generation current conveyor being connected to the Y-input of the fourth positive polarity second-generation current conveyor;
   an input resistor having a first terminal and a second terminal, the first terminal of the input resistor being connected to the X-input of the first positive polarity second-generation current conveyor and the X-input of the third positive polarity second-generation current conveyor, the second terminal of the input resistor being connected to the X-input of the second positive polarity second-generation current conveyor and the X-input of the fourth positive polarity second-generation current conveyor;
   a first input voltage applied to the Y-input of the first positive polarity second-generation current conveyor; and
   a second input voltage applied to the Y-input of the second positive polarity second-generation current conveyor;
   whereby a first current at the Z-output of the third positive polarity second-generation current conveyor is equal to the negative of a second current at the Z-output of the fourth positive polarity second-generation current conveyor, the second current being equal to the difference between the first input voltage and the second input voltage multiplied by the negative reciprocal value of the input resistor.

2. The balanced output signal generator according to claim 1, further comprising:

a first load resistor connected to the Z-output of the third positive polarity second-generation current conveyor to generate a first output voltage; and a second load resistor equal in value to the first load resistor, the second load resistor being connected to the Z-output of the fourth positive polarity second-generation current conveyor to generate a second output voltage;

whereby the first output voltage is equal to the negative of the second output voltage, the second output voltage being equal to the difference between the first input voltage and the second input voltage multiplied by the negative of the second load resistor value divided by the input resistor value.

\* \* \* \* \*